June 28, 1966 J. P. WITTMAN 3,258,704
FREQUENCY AND AMPLITUDE STABLE AMPLIFIER
Filed April 1, 1963

INVENTOR.
JOHN P. WITTMAN
BY
Lippincott, Ralls & Hendricson
ATTORNEYS 3,258,704
Patented June 28, 1966

3,258,704

FREQUENCY AND AMPLITUDE STABLE AMPLIFIER

John P. Wittman, Santa Clara, Calif., assignor, by mesne assignments, to Automatic Electric Laboratories, Inc., Northlake, Ill., a corporation of Delaware Filed Apr. 1, 1963, Ser. No. 269,557
5 Claims. (Cl. 330—13)

Figure 1:
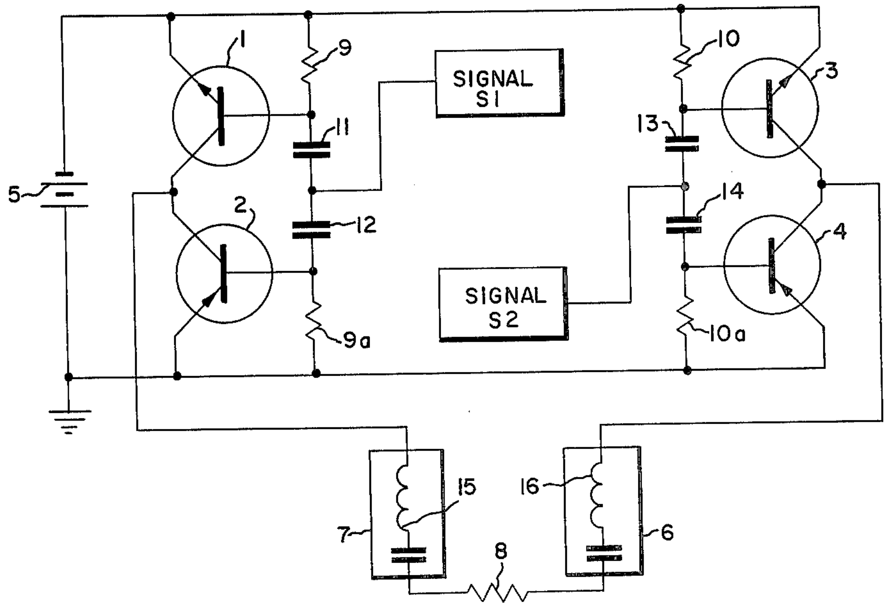

This invention relates to a low loss, regulated output, high frequency amplifier. More specifically, the invention provides an amplifier using two transistors, one PNP and one NPN, which alternate between cutoff and saturation condition in reciprocal relationship to each other. The arrangement of these transistors produces an amplifier requiring no transformer in the output stage. Elimination of the conventionally-required output transformer renders possible many high frequency applications heretofore hindered by the transformer's limitations.

In copending application Serial No. 245,927, now abandoned, of the same inventor and assigned to the same assignee as the present invention, an amplifier having a very low loss characteristic was described. The amplifier of the present invention also has a low loss regulated output, similar to that amplifier, but additionally obviates the need for a transformer in the output stage. At high frequencies, i.e., above about 50 kc., such transformer imperfections as inter-winding capacitance and leakage inductance combine to create what is termed a "ringing frequency." As the frequency of the signal increases, a phenomenon called "ringing" occurs. This ringing causes voltage surges across the transistors which are far in excess of the maximum voltages otherwise appearing. The possibility of such surges necessitates the use of transistors able to withstand them. Were this precaution not taken, the transistors would be likely to burn out during the voltage surges. However, transistors with the necessary voltage ratings are complex and difficult to manufacture. Moreover, the need for excess voltage capacity in the transistors not only increases their expense, but also decreases their reliability—consequently, it would be preferable to avoid their use.

The amplifier of this invention uses no output transformer. The A.-C. output signal appearing at the collectors of the transistors is passed directly to a filter which removes all frequency components other than that one desired for the load. Furthermore, by means of circuit modifications which will be described later, the amplifier of this invention can function with either a balanced load or with a load having one terminal at ground potential.

Most important, the amplifier of the invention makes possible the construction of a unique standby power system. Using a grounded load, the outputs of two sections, each comprising an amplifier of the invention, may be connected through identical filters to the ungrounded terminal of the load. During normal operation, each section furnishes one-half of the necessary load power; but when one section fails for any reason, the other section automatically furnishes all the necessary power. Contrary to prior-art standby systems, neither section requires more power than actually needed to furnish its half of the normal operating load requirement. With prior-art Class A amplifiers in a standby system, each amplifier had to use twice the power required by the load, no matter whether both were functioning or whether one was carrying on alone. This requirement involved a 75% power waste when both sections were operating, and a 50% waste if only one were operating, in order to achieve the needed standby capacity. Certain features of this invention prevent damage to one section of a double amplifier when the other section is rendered inoperable by shorted or open-circuited transistors.

In essence, the basic amplifier circuit of the invention employs two transistors, one NPN and the other PNP. The collectors are common, and input signals are passed to the bases. A D.-C. voltage supply is coupled across the emitters of the two transistors in series. The two in-phase input A.-C. signals to the two bases causes one transistor of the pair to alternate between cutoff and saturation while the other alternates similarly between saturation and cutoff, 180° out-of-phase with the first. As the signal reverses itself, the condition of each of the two transistors reverses. The output signal from the transistors at their common collectors is passed through a filter having a bandpass frequency equal to that required by the load. Thus a square wave voltage output signal from the transistors is converted by the filter to a sinusoidal voltage output of the desired frequency. The output signal from the filter passes into the load.

For a balanced load, two pairs of transistors are required. Each pair of common collectors is connected to a separate filter (although the coils may be commonly wound, if desired). The signal from the filter passes into opposite terminals of the balanced load. Two signals are required, one for each pair of transistors; one signal is 180° out-of-phase with the other. The supply voltage is connected across the emitters.

The double amplifier providing standby capability uses two basic amplifier sections, each being an amplifier of the invention. The common collectors of each section are connected through filters to the ungrounded terminal of a grounded load. A properly-biased diode between the common collectors of each section, along with fuses between the emitters of one transistor of each section and the voltage supply, will prevent damage to the remaining section from shorting or opening of transistors in one section of the double amplifier.

Figure 2:
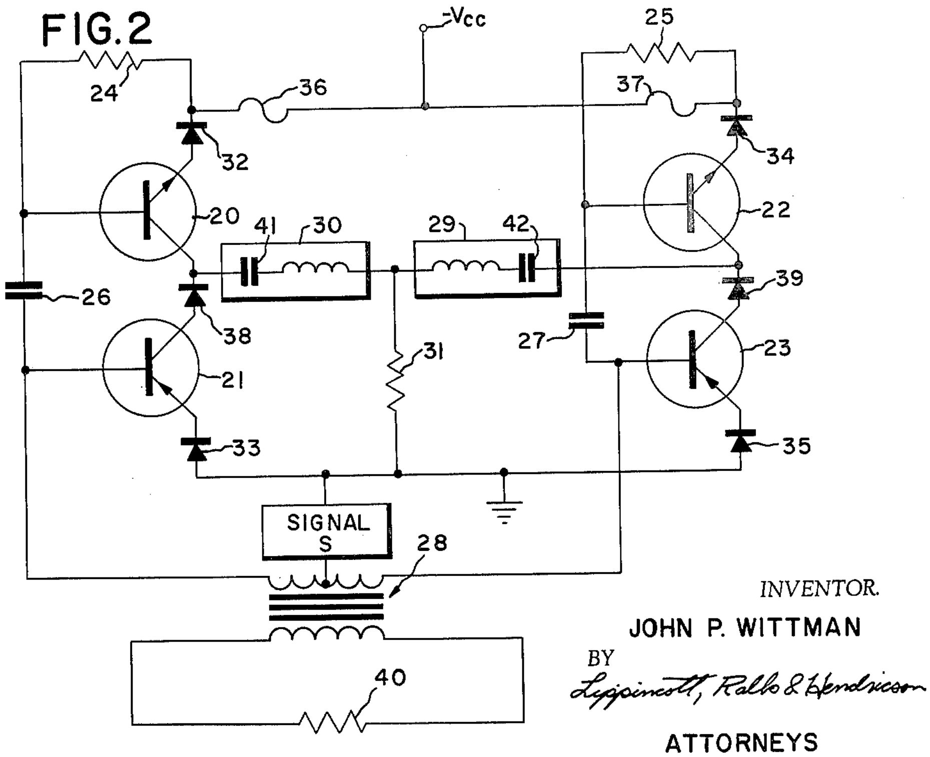

Further details of the invention will be best understood from the following description making reference to the drawing, in which:

FIG. 1 is a schematic circuit diagram of an embodiment of an amplifier of the invention using a balanced load; and FIG. 2 is a schematic circuit diagram of a two-section double amplifier of another embodiment of the invention.

FIG. 1 shows an amplifier of this invention furnishing power to a balanced load. The amplifier has two channels, the first having NPN transistor 1 and PNP transistor 2, and the second having NPN transistor 3 and PNP transistor 4. A D.-C. power supply, shown as battery 5, supplies a D.-C. voltage across the emitters of the two transistors of each channel. The negative terminal of battery 5 is connected to the N-type emitters of the NPN transistors 1 and 3, and the positive terminal to the P-type emitters of the PNP transistors 2 and 4. For proper operation, the battery terminal is connected to the emitter of the same polarity as the terminal. Should the polarities of the transistors be reversed (PNP transistors becoming NPN, and vice versa), then the battery polarity is also reversed.

Two signals, $S_1$ and $S_2$, are fed into the base terminals of transistor pairs 1 and 2, and 3 and 4, respectively. These two signals are 180° out-of-phase with each other. Since each transistor pair has one transistor of each polarity, a signal to the bases of either pair will cause one of the two transistors to become cut off. A positive amplitude signal will turn off a PNP transistor and a negative amplitude signal similarly will turn off an NPN transistor. For example, when positive signal $S_1$ turns off transistor 2 and puts transistor 1 into saturation, then negative signal $S_2$ will turn off transistor 3 and put transistor 4 into saturation. Since the emitter of the saturated transistor 4 is connected to the positive battery terminal, the common collectors of transistors 3 and 4 are made positive, and a positive signal appears at the input to filter 6. Similarly, with transistor 2 cut off and transistor 1 on, the collectors of transistors 1 and 2 are negative and a negative signal appears at the input to filter 7. As the input signals S1 and S2 reverse their polarity, the previously-saturated transistors are cut off, and the previously-cutoff transistors become saturated. The polarity of the input signal at filters 6 and 7 is then precisely opposite from its previous state. Thus, the input signals appearing at filters 6 and 7 are square voltage waves. The filters, tuned to a predetermined desired frequency, convert this square voltage wave to a sinusoidal voltage wave of frequency equal to the filter bandpass frequency. The current through resistive load 8 is also sinusoidal, and in phase with the voltage. This load is called a balanced load, because neither of its two terminals is grounded. The bases of the upper transistors 1 and 3 (NPN) are referenced through resistors 9 and 10 to the negative terminal of battery 5. The bases of the lower transistors 2 and 4 are referenced through resistors 9*a* and 10*a* to the positive battery terminal. To keep these D.-C. reference points of opposite polarity separate from each other, blocking capacitors 11, 12, 13 and 14 are used. Resistors 9 and 10 serve to discharge capacitors 11 and 13 during one half of the amplifiers cycle of operation. Similarly resistors 9*a* and 10*a* discharge capacitors 12 and 14. This separation prevents the capacitors' building up sufficient charge from the input signal to have an undesirable effect later on the transistor switching operation.

Filters 6 and 7 are shown separately in FIG. 1. It is well known that, in practice, coils 15 and 16 may be wound on the same core. The bandpass frequency range may be varied by using a tunable inductor, or tunable capacitors, or both. For practical reasons of manufacture, it is usually preferable to use tunable inductors; however, the choice of proper filter is one for the practitioner.

The particular embodiment of the invention shown in FIG. 2 uses two separate amplifiers of the invention connected together to service a common load. Each section could operate separately, and each must be considered an embodiment of this invention. NPN transistor 20 and PNP transistor 21 constitute one amplifier section and NPN transistor 22 and PNP transistor 23 constitute the other. In this embodiment, the source of D.-C. voltage is represented by $-V_{cc}$. This source may of course be a battery, or any other suitable constant D.-C. voltage supply. The supply voltage $-V_{cc}$ is connected with the negative terminal to the N-type emitters and the positive terminal to the P-type emitters.

The bases of the upper transistors 20 and 22 (NPNs) are referenced, through resistors 24 and 25, to the supply voltage $-V_{cc}$. The bases of the lower transistors 21 and 23 are referenced to ground. To keep these D.-C. references separate, blocking capacitors 26 and 27 are used. Resistors 24 and 25 serve to discharge capacitors 26 and 27, respectively, during one half the cycle of the amplifier operation, so that these capacitors do not build up sufficient charge from the A.-C. signal to bias the transistors improperly and prevent the switching operation of the amplifier.

A signal S is applied to the bases of all the transistors 20, 21, 22 and 23 through transformer 28. This input transformer 28 is part of a hybrid unit, to be described later, which serves to provide a constant signal on each section of the amplifier even when the other section is inoperative.

In this embodiment (FIG. 2), the signals to all four of the bases of transistors 20, 21, 22, and 23 are in phase with each other. However, one transistor of each PNP–NPN pair will still be cut-off while the other is in saturation because of the reciprocal relationship of the transistors. A positive signal will cut off the PNP transistors 21 and 23 and turn on NPN transistors 22 and 24. When the lower PNP transistors are on, the input to each filter 29 and 30, connected to the common collectors of one of the transistor pairs, is at ground. When the upper NPN transistors are on, the input to filters 29 and 30 is at $-V_{cc}$. The transistors alternate at the frequency of the input signal between saturation and cutoff. The input signal to both filters 29 and 30, therefore, continues to alternate between ground and $-V_{cc}$. Each filter thus has a square wave voltage input. The filters convert this signal to a sine wave into the load. The signal from each filter is phased with the signal from the other. Each section of the amplifier, in accordance with well-known current division principles, supplies one-half of the total power to the load. Since the load is resistive, the current is in phase with the voltage.

Still referring to FIG. 2, diodes 32, 33, 34, and 35 are optional, and are used to prevent burning out of components by an effect known as "thermal runaway." When a small resistance exists in the secondary winding of transformer 28 (and no transformer is perfect), power is dissipated in this resistance even when no signal S is applied to the center tap. Leakage current passes from ground through half of the secondary winding of transformer 28 into the bases of transistors 21 and 23. The current continues to flow across the base-collector junctions through the collectors and into transistors 20 and 22. Similarly, leakage current passes from the collectors of transistors 20 and 22 across their collector-base junctions through their bases, and through resistors 24 and 25 to the voltage supply $-V_{cc}$. The combined D.-C. voltage drop across the secondary winding of transformer 28 and across the signal source S, appearing at the bases of transistors 21 and 23, may be sufficient to bias the transistors into their linear region from cutoff. Similarly, voltage drops across resistors 24 and 25 because of this leakage current appearing at the bases of transistors 20 and 22 may become sufficient to bias these transistors from their cutoff regions into their linear region. Power will then be dissipated in the transistors, causing them to become heated; the heat, by the thermal phenomenon well known in the art, increases the leakage current in turn. As the leakage current becomes larger, the transistors become still hotter, causing "thermal runaway." The high runaway current will damage some components of the system—usually the transistors. In the embodiment of FIG. 2, fuses 36 and 37 (or one of them) will normally be blown should thermal runaway be permitted to occur.

Diodes 33 and 35 are used to prevent thermal runaway in transistors 21 and 23. When leakage current tends to turn on transistors 21 and 23, the resulting emitter current develops a small forward voltage across diodes 33 and 35 which is generally sufficient to keep the transistors cut off and so prevent thermal runaway. Diodes 32 and 34 provide the same protection for transistors 20 and 22. In other words, the voltage at the emitters as a result of the diode placement compensates for the voltage at the bases due to leakage current. In consequence, the transistors are caused to remain cut off, and thermal runaway is prevented. A signal at the input of the transistors presents no thermal runaway problem because the signal itself will bias the transistor properly.

Diodes 38 and 39 cooperate with fuses 36 and 37 and resistor 40 (on the primary winding of hybrid transformer 28) to protect one section of the amplifier from damage when the transistors of the other section become open- or short-circuited. To understand this operation, it is helpful to examine a typical malfunction.

Assume that transistor 20 develops an open circuit in its emitter. Capacitor 41 rapidly charges up, to a voltage determined by the peak voltage of the output signal from the other section of the amplifier. Capacitor 41 can no longer discharge through transistor 20 during half of the cycle, as it previously could, because of the open emitter circuit. Consequently, the voltage on capacitor 41 remains essentially constant. Voltage surges of the left amplifier section (comprising transistors 20 and 21) will no longer affect the load. These surges are blocked from the load by the fully charged capacitor 41. Now the entire power for the load must be supplied by the right section of the amplifier. The situation is analogous to that of a circuit in which two batteries are connected in parallel with a resistor by means of two diodes, When both batteries are connected, each provides half the current to the resistor, and therefore half the dissipated power; but when one battery is removed (or replaced by a charged capacitor), the remaining one will have to provide the entire current and therefore the entire power.

In the apparatus of FIG. 2, assume that upper transistor 20 becomes shorted from emitter to collector. As soon as lower transistor 21 turns on, a direct path is provided from the supply $-V_{cc}$ to ground. The only previous path to ground was through the load, because the two transistors 20 and 21 were never on simultaneously. The direct path to ground now provided will enable a large current to flow, and this in turn will cause fuse 36 to blow. With this fuse out of the circuit, the situation becomes identical to the one described above, where an open circuit developed in the emitter of transistor 20. Capacitor 41 becomes charged as before, and the left section of the amplifier is essentially removed from the circuit.

Should lower transistor 21 become open-circuited in the emitter, the sequence of events is essentially the same as that when the upper transistor 20 becomes open-circuited. However, in the former instance, the remaining transistor (20) has its emitter connected to the supply voltage $-V_{cc}$ rather than to ground, and capacitor 41 therefore charges up to the peak voltage furnished by the right amplifier section, as before, augmented by the magnitude of the supply voltage $-V_{cc}$.

When lower transistor 21 shorts out, a direct path will also be provided to ground during one half-cycle, and fuse 36 will burn out. In this case, however, were it not for diode 38, a permanent short circuit to ground would exist, and capacitor 41 could not remain charged. Diode 38 converts this short to a "unidirectional short." By this means, capacitor 41 can charge up to the peak voltage of the signal from the other section without thereafter discharging to ground through the short.

Analogous reasoning may also be applied to the right amplifier section. Fuse 37, capacitor 42, and diode 39 perform in the same manner as their analogs in the left amplifier section. Whenever the right section becomes inoperative, the left section supplies the full amount of power, just as the right section did in the reverse situation.

Input transformer 28 plays an important role whenever one section of the amplifier has become inoperative. The circuitry used is a modification of a "hybrid" circuit well known in the art. During normal operation, the signal is coupled to the center tap on the secondary, as shown. No transformer coupling is needed between primary and secondary because the current in the left half of the secondary is equal and opposite to the current in the right half. This relationship results in equal but opposite fluxes, which cancel each other. However, as soon as one section of the amplifier becomes inoperative (open or short) the secondary currents are no longer in balance. As is known in the art, the hybrid circuit then permits a part of the current to be coupled into the primary; the power which would otherwise be used in the inoperative section is then dissipated in the balancing resistor 40 (connected in parallel with the primary winding of transformer 28).

Now that the details of the circuit have been explained, certain features of the invention will become apparent. Note that the supply voltage is never shorted to ground. It is either connected to the load, or open-circuited, because the two transistors of a single section of the amplifier are never both on at the same time in normal operation. This feature prevents damage to the voltage supply.

Furthermore, all power from the battery is coupled to the load. With both amplifier sections operating, one-half of this power is coupled through one section and the remaining half through the other section. When one section is inoperative, all the power is coupled through the operative section. Standby capability is thus achieved without power waste.

In conclusion, emphasis is again placed on the fact that no transformer is required in the output stage of the amplifier. For this reason, those problems in "ringing" which are normally encountered where a transformer output is used are entirely avoided. This permits use of switching transistors with relatively low voltage ratings, and means that the amplifier is a very practical one. The power losses in the transistors, moreovre, are but a small fraction of those encountered in a normal class A amplifier.

It will be apparent to one skilled in the art that many changes may be made in the preferred embodiments of the invention shown and described in detail here which are well within the spirit and scope of the invention. Consequently, the only limitations upon that scope are those recited in the claims which follow.

What is claimed is:

1. An A.-C. amplifier having an amplitude-stable A.-C. output signal of a single frequency band irrespective of changes in the amplitude of the A.-C. input signal, which comprises:

(a) a first transistor having a base of N-type conductivity type and an emitter and collector of P conductivity type;

(b) a second transistor having an emitter and collector of N conductivity type and a base of P conductivity type;

(c) a means connecting the collectors of said two transistors together;

(d) a means for passing two in-phase input signals to the respective bases of said transistors;

(e) a D.-C. voltage supply means having a positive and a negative terminal;

(f) a first diode coupling the positive terminal of said D.-C. voltage supply means in series with the P-type emitter of one of said transistors, the cathode of said diode being connected to said emitter;

(g) a second diode coupling the negative terminal of said D.-C. voltage supply means in series with the N-type emitter of the other of said transistors, the anode of said diode being connected to said emitter; and (h) a bandpass filter adapted to pass only said single frequency band coupling the connected collectors of said transistors in series with a load to be driven by said amplifier.

2. An D.-C. amplifier having an amplitude-stable output signal of a single frequency band irrespective of changes in the amplitude of the A.-C. input signal, for providing a signal to a balanced load, which comprises:
(a) two pairs of transistors, one of each pair being an NPN transistor and the other being a PNP transistor, the transistors of each pair having common bases and common collectors;
(b) a means for passing a first A.-C. input signal to the common bases of one pair of said transistors;
(c) a means for passing a second A.-C. input signal, 180° out-of-phase with the first, to the common bases of the other pair of said transistors;
(d) a D.-C. voltage supply means having a positive and a negative terminal, the positive terminal connected to the emitters of both PNP transistors and the negative terminal connected to the emitters of both NPN transistors;
(e) a balanced load having two terminals; and
(f) a pair of bandpass filters each adapted to pass only said single frequency band, one coupling the common collectors of each pair of transistors in series with opposite terminals of said load.

3. An A.-C. amplifier having an amplitude-stable output signal of a single frequency band irrespective of changes in the amplitude of the A.-C. input signal, for providing a signal to a balanced load, which comprises:
(a) two pairs of transistors, one of each pair being an NPN transistor and the other being a PNP transistor, the transistors of each pair having common bases and common collectors;
(b) a means for passing a first A.-C. input signal to the common bases of one pair of said transistors;
(c) a means for passing a second A.-C. input signal, 180° out-of-phase with the first, to the common bases of the other pair of said transistors;
(d) a D.-C. voltage supply means having a positive and a negative terminal;
(e) a first pair of diodes, one coupling the emitters of each PNP transistor in series with the positive terminal of said D.-C. voltage supply means, the cathode of said diodes being connected to said emitter;
(f) a second pair of diodes, one coupling the emitters of each NPN transistor in series with the negative terminal of said D.-C. voltage supply means, the anode of said diode being connected to said emitters;
(g) a balanced load having two terminals;
(h) a pair of bandpass filters each adapted to pass only said single frequency band, one coupling the common collectors of each pair of transistors in series with opposite terminals of said load.

4. A double A.-C. amplifier having standby facilities such that when one section is inoperative the other section furnishes the total power required, said amplifier having an amplitude-stable A.-C. output signal of a single frequency band irrespective of changes in the amplitude of the A.-C. input signal, which comprises:
two amplifier sections, each comprising:
(a) a first transistor having a base of one conductivity type of an emitter and collector of the opposite conductivity type;
(b) a second transistor having an emitter and collector of said one conductivity type, and a base of said opposite conductivity type;
(c) an output terminal;
(d) a diode coupling said output terminal in series with the collector of said first transistor, the anode of said diode being connected to said collector;
(e) means connecting the collector of said second transistor to said output terminal;
(f) a means for passing a first A.-C. input signal to the base of one of said transistors of each pair;
(g) a means for passing a second A.-C. input signal, in phase with the first, to the base of the other transistor of each pair;
(h) a D.-C. voltage supply means having a positive and a negative output terminal;
(i) a pair of fuses, one coupling one terminal of of said D.-C. voltage supply means in series with the emitter of one transistor of one section, and the other coupling said terminal of said D.-C. voltage supply means in series with the emitter of the corresponding transistor of the other section;
(j) means coupling the emitter of the other transistor of each section with the other terminal of said D.-C. voltage supply means;
(k) a load having two terminals; and
(l) a pair of bandpass filters, each adapted to pass only said single frequency band, one coupling the common collectors of the transistors of each section in series with the same terminal of said load, the other terminal being grounded, whereby each section furnishes about one-half of the power to said load during normal operation, but when either section is rendered inoperative, the other section automatically increases the supplied power to equal the total amount previously furnished by both sections.

5. A double A.-C. amplifier having standby facilities such that when one section is inoperative the other section furnishes the total power required, said amplifier having an amplitude-stable A.-C. output signal of a single frequency band irrespective of changes in the amplitude of the A.-C. input signal, which comprises:
two amplifier sections, each comprising:
(a) a first transistor having a base of one conductivity type and an emitter and collector of the opposite conductivity type;
(b) a second transistor having an emitter and collector of said one conductivity type, and a base of said opposite conductivity type;
(c) an output terminal;
(d) a diode coupling said output terminal in series with the collector of said first transistor, the anode of said diode being connected to said collector;
(e) means connecting the collector of said second transistor to said output terminal;
(f) a means for passing a first A.-C. input signal to the base of one of said transistors of each pair;
(g) a means for passing a second A.-C. input signal, in phase with the first, to the base of the other transistor of each pair;
(h) a D.-C. voltage supply means having a positive and a negative output terminal;
(i) a first pair of diodes, each coupling the emitter of the first transistors of each amplifier section with the negative terminal of said D.-C. voltage supply means, the cathode of said diodes being connected to said negative terminal;
(j) a second pair of diodes, each coupling the emitter of the second transistor of each amplifier section with the positive terminal of said D.-C. voltage supply means, the anode of said diodes being connected to said positive terminal;
(k) a pair of fuses, each connected in series with one diode of each of said pairs of diodes;
(l) a load having two terminals; and
(m) a pair of bandpass filters, each adapted to pass only said single frequency band, one coupling the common collectors of the transistors of each amplifier section in series with the same terminal of said load, the other terminal being grounded, whereby each section furnishes about one-half of the power to said load during normal operation, but when either section is rendered inoperative, the other section automatically increases the supplied power to equal the total amount previously furnished by both sections.

References Cited by the Examiner

UNITED STATES PATENTS

| | | | |
|---|---|---|---|
| 2,860,193 | 11/1958 | Lindsay | 330—14 X |
| 2,972,710 | 2/1961 | D'Amigo. | |
| 3,078,379 | 2/1963 | Plogstedt et al. | |
| 3,115,582 | 12/1963 | Yoshii et al. | 330—18 X |
| 3,151,300 | 9/1964 | Pommerening | 330—51 |
| 3,160,766 | 12/1964 | Reymond. | |
| 3,173,022 | 3/1965 | Kunsch. | |
| 3,183,366 | 5/1965 | Brode. | |
| 3,195,068 | 7/1965 | Du Vall. | |

OTHER REFERENCES

Ryder: Networks, Lines and Fields, Prentice-Hall, N.J., 1955, page 61 relied on.

ROY LAKE, *Primary Examiner.*

P. D. PARIS, *Assistant Examiner.*